United States Patent [19]
Mita et al.

[11] Patent Number: 5,629,550
[45] Date of Patent: May 13, 1997

[54] PHOTODIODE BUILT-IN SEMICONDUCTOR DEVICE WITH DUMMY PHOTODIODE

[75] Inventors: Keiji Mita, Ora-gun; Osamu Shiroma, Ota, both of Japan

[73] Assignee: Sanyo Electric Co., Ltd., Osaka, Japan

[21] Appl. No.: 521,066

[22] Filed: Aug. 29, 1995

[30] Foreign Application Priority Data

Aug. 31, 1994 [JP] Japan ................. 6-207588

[51] Int. Cl.⁶ ............................................. H01L 31/00
[52] U.S. Cl. .................. 257/435; 257/443; 257/446; 257/448; 257/465
[58] Field of Search ........................ 257/435, 446, 257/448, 443, 465

[56] References Cited

U.S. PATENT DOCUMENTS

| | | | |
|---|---|---|---|
| 4,691,101 | 9/1987 | Leonard | 250/231.16 |
| 4,733,264 | 3/1988 | Hatase et al. | 354/430 |
| 4,998,013 | 3/1991 | Epstein et al. | 250/231.14 X |
| 5,182,625 | 1/1993 | Miyake et al. | 257/448 X |
| 5,243,192 | 9/1993 | Miyauchi et al. | 250/338.1 |

FOREIGN PATENT DOCUMENTS

| | | |
|---|---|---|
| 60-120556 | 6/1985 | Japan. |
| 60-152079 | 8/1985 | Japan. |
| 1127165 | 6/1986 | Japan. |
| 6-163977 | 6/1994 | Japan. |
| 6-163868 | 6/1994 | Japan. |

*Primary Examiner*—William Mintel
*Attorney, Agent, or Firm*—Wenderoth, Lind & Ponack

[57] ABSTRACT

A photodiode built-in semiconductor device is provided that can prevent internal peripheral circuits from erroneously operating due to incident light entering slantingly, or not perpendicular to a top surface of the semiconductor chip. A semiconductor chip 20 includes a photodiode and its peripheral circuits. The region except for the photodiode is covered with a light shielding film 22 of aluminum metallization. An isolation region (P⁺) 23 is arranged at an outermost portion of the chip. A dummy island 24 is formed so as to surround the entire portion of the chip 20. An N⁺-type low resistance region 25 is formed in the surface of the dummy island 24. The dummy photodiode is formed by applying a reverse bias potential across the PN junction defined between the isolation region 23 and the dummy island 24.

6 Claims, 4 Drawing Sheets

PHOTODIODE BUILT-IN SEMICONDUCTOR DEVICE WITH DUMMY PHOTODIODE

BACKGROUND OF THE INVENTION

1. Field of the Invention

The present invention relates to a photodiode built-in semiconductor device for light signal reception. The device can prevent an erroneous operation in accordance with unnecessary incident light.

2. Description of the Related Art

Semiconductor devices which include a light receiving photodiode and its peripheral circuits have been used on the receiving side of various light signal transmission systems. For example, in an infrared-ray signal transmission system, or in light pick-up devices of laser-signal readers, such semiconductor devices including a photodiode and its peripheral circuits are utilized. There are two kinds of photodiode built-in semiconductor devices. One is a monolithically integrated semiconductor device on a silicon substrate, and the other is a hybrid-integrated device arranging discrete devices on a ceramics substrate. Monolithically integrated devices can lower costs in manufacture compared with hybrid type devices, and are immune to external electromagnetic noises. Therefore monolithically integrated semiconductor devices are the subject matter of the present invention.

Since a photodiode, its peripheral NPN transistors, and so on coexist in a photodiode built-in semiconductor device, it is necessary to block incident light other than the photodiode in order not to generate light currents in the peripheral circuits depending on unnecessary light injections.

The simple and easy method for blocking light injections to peripheral circuits is to cover the peripheral circuits regions with a top aluminum metallization film (or wiring layer) by using one of multilayer metallizations for semiconductor integrated circuit devices. However, bonding pads which are arranged on the semiconductor device to connect the internal circuits to external circuits with a wire must be formed on the chip by using at least one of multilayer metallizations. Hence a space is formed between the bonding pads and the light shielding film on the periphery circuits. Therefore unnecessary light injects in to the periphery circuits through the space, and causes undesired light current generation in the periphery circuits.

The inventors of the present invention already proposed a structure of a photodiode built-in semiconductor device that can block light injection from the space between the bonding pads and the light shielding film with Japanese Patent Application No. (Heisei) 4-287582.

FIGS. 4 through 6 show the structure of the above-mentioned photodiode built-in semiconductor device. In these figures, numeral 10 represents a bonding pad; numeral 11 represents an extension region of the bonding pad; numeral 12 represents a light shielding film; and numeral 13 represents a second light shielding film. As shown in FIG. 5, the bonding pad 10 is formed by laminating sequentially the first, second, and third aluminum metallizations (or wiring layers) 14, 15, and 16. The extension region 11 of the bonding pad 10 is formed so as to expand outward the second aluminum metallization 15, other than the metallizations 14 and 16. The second light shielding film 13 is disposed between the metallizations 14 and 14 of the bonding pads 10 and 10, with the extension region 11 overlapped with the film 13. A second interlayer insulating film 17 insulates the expanding bonding pad region 11 from the second light shielding portion 13. Similarly, the light shielding film 12 formed of the third aluminum metallization 16 is arranged so as to overlap with the extension portion 11 of the second metallization 15 of the bonding pad 10. The light shielding film 12 is insulated from the extension portion 11 by the second interlayer insulating film 18. As stated above, utilizing multilayer metallizations and multilayer insulations, the top surface of the silicon substrate is entirely covered with aluminum metallizations overlapped with each other, except for an exposure surface of the photodiode.

The above-mentioned structure is very effective with the light injected perpendicularly to the top surface of the chip, but is defenseless to the light injected slantingly, or not perpendicularly to the top surface of the chip. In other words, the light shielding films 12 and 13 do not have any light shielding effect as to the light 19 injected perpendicular to the side surface (diced cut surface) of the chip. As a result, if there is light which is injected in a direction that is not perpendicular to the top surface of the photodiode built-in semiconductor chip, then it generates photocurrent at the PN junctions of the periphery circuits of the semiconductor device, causing erroneous operation. Since the dicing step inevitably follows after a completion of the wafer process, it is technically impossible to form the light shielding film on the side surface of the photodiode built-in semiconductor chip.

SUMMARY OF THE INVENTION

In order to overcome the above mentioned technical problems, the object of the present invention is to provide a photo-diode built-in semiconductor device that can protect peripheral circuits from erroneous operation caused by incident light injected at a slant, or in a direction that is not perpendicular to the top surface, of the chip, by means of arranging a dummy photodiode formed on the outermost portion of the chip.

According to the present invention, the photodiode built-in semiconductor device, wherein a photodiode for light signal reception and its peripheral circuits are integrated on a semiconductor chip, is characterized by a dummy photodiode arranged on the outermost portion of the semiconductor chip.

In the photodiode built-in semiconductor device according to the present invention, an isolation region and a dummy island is arranged at an outermost portion of the semiconductor chip, the dummy photodiode being composed of a PN-junction formed between the dummy island and the isolation region.

According to the present invention, the photodiode built-in semiconductor device further includes a light shielding film of an electrode metallization covering the upper portions of the peripheral circuits.

According to the present invention, the photodiode built-in semiconductor device further includes bonding pads used for external connections and wherein the dummy island is arranged under the space between the bonding pads and the light shielding film.

As stated above, according to the present invention, since most of light injections that are injected slantingly to the top surface of the chip are converted into photo-currents by the dummy photodiode formed in the outermost circumference of the photodiode built-in semiconductor device, the light cannot reach the internal peripheral circuits. Therefore, the internal peripheral circuits can be protected from being erroneously operated due to light injections therein.

BRIEF DESCRIPTION OF THE DRAWINGS

The above and other objects of the present invention will become apparent from the following drawings and detailed description, taken in connection with the drawings, in which.

DETAILED DESCRIPTION OF THE PREFERRED EMBODIMENTS

A preferred embodiment according to the present invention will be explained below in detail with reference to the attached drawings.

Figure 1:
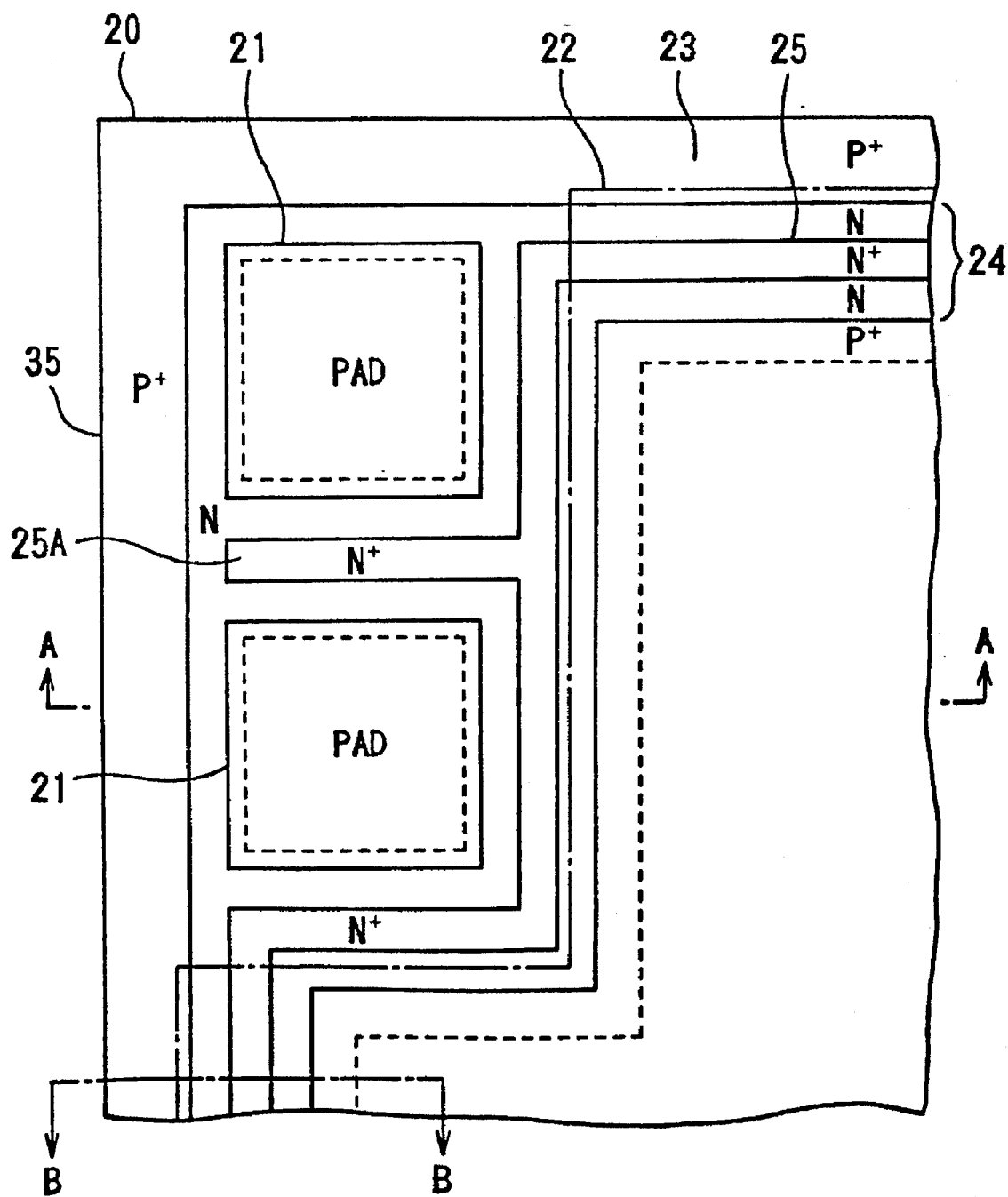
FIG. 1 is a plan view partially showing a corner of a photodiode built-in semiconductor device according to the present invention.
Figure 2:
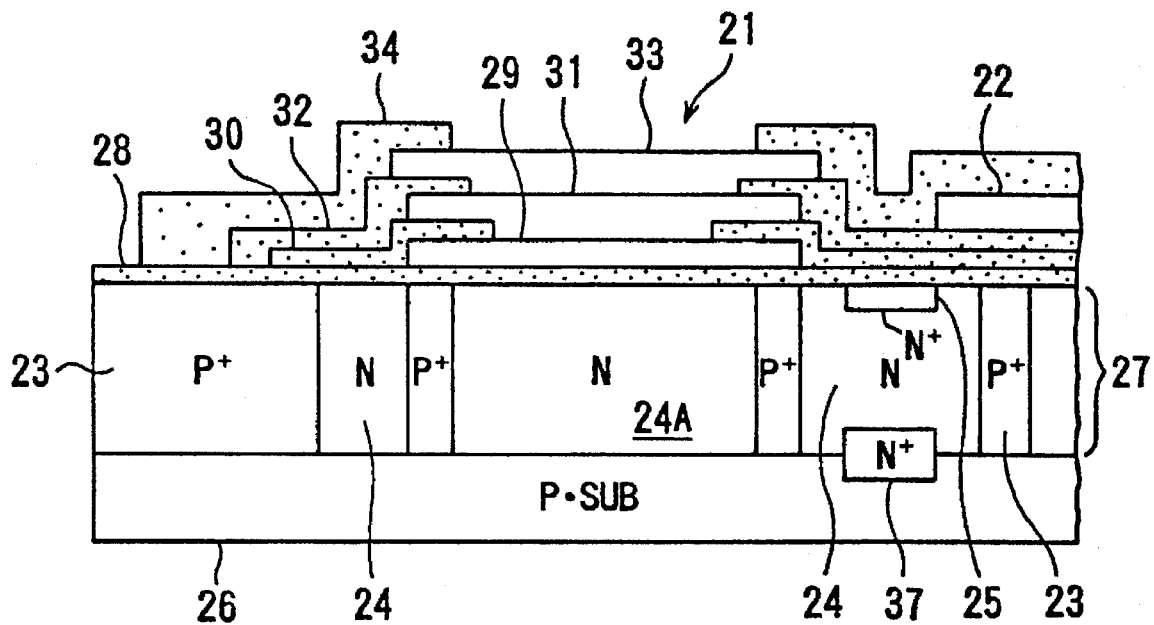
FIG. 2 is a cross-sectional view taken along line A—A of FIG. 1, partially showing a bonding pad portion of the present invention.
Figure 3:
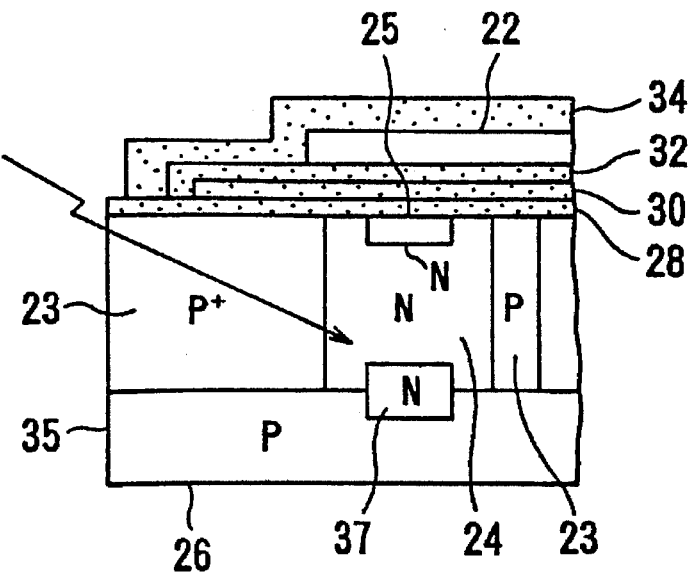
FIG. 3 is a cross-sectional view taken along line B—B of FIG. 1, partially showing a dice cut side of the photodiode built-in semiconductor chip of the present invention.
Figure 4:
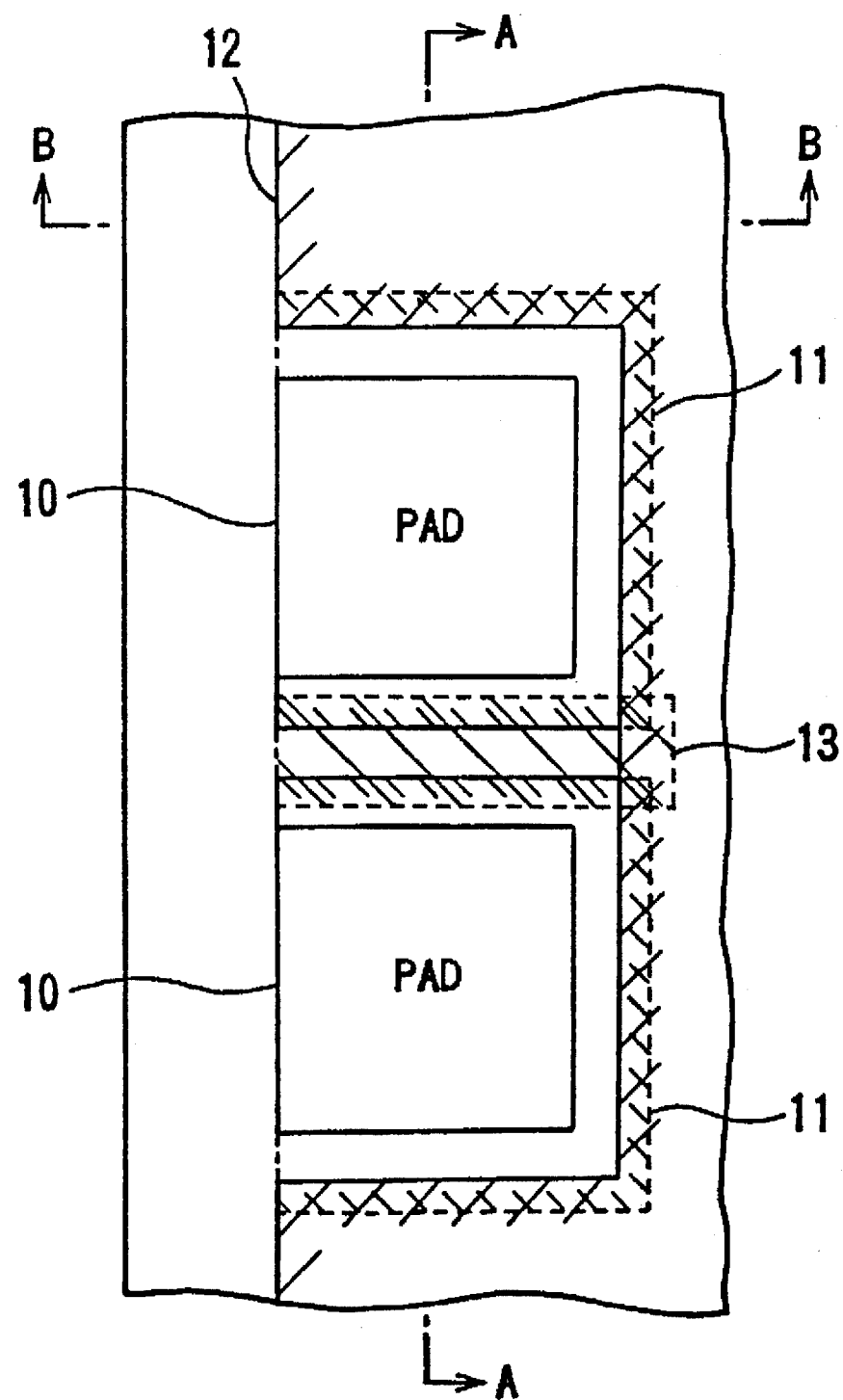
FIG. 4 is a plan view partially showing a corner of a prior-art photodiode built-in semiconductor device.
Figure 5:
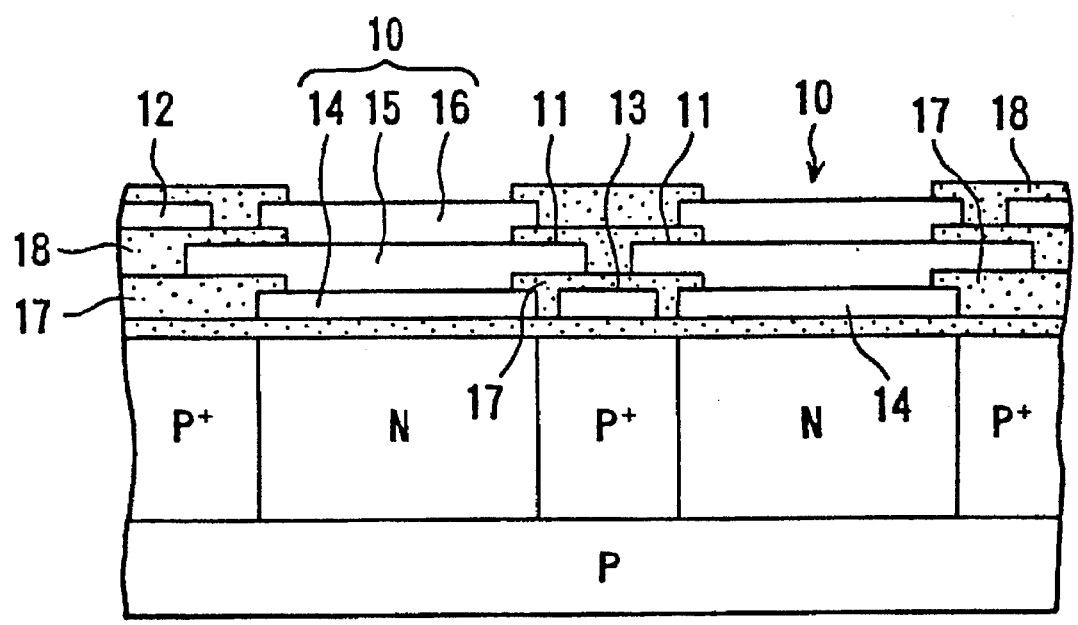
FIG. 5 is a plan view taken along line A—A of FIG. 4, partially showing a bonding pad portion of the prior-art device.
Figure 6:
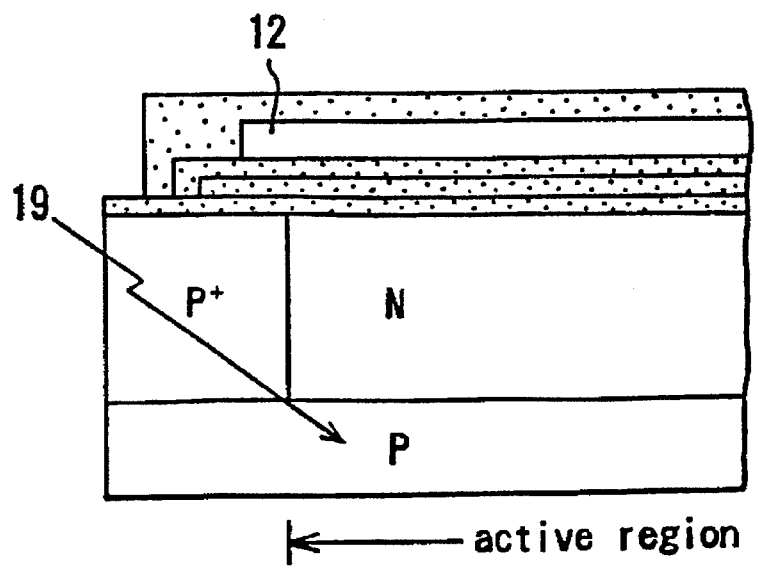
FIG. 6 is a cross-sectional view taken along line B—B of FIG. 4, partially showing a dice cut side of the prior-art photodiode built-in semiconductor device.

FIGS. 1, 2 and 3 show a partial outermost portion of a photodiode built-in semiconductor chip according to the present invention. Referring to FIG. 1, numeral 20 represents a portion of a silicon semiconductor chip; numeral 21 represents a bonding pad on which a wire is bonded for a connection between an internal circuit and an external circuit; numeral 22 represents a light shielding film of aluminum metallization; numeral 23 represents a $p^+$-type heavily-doped isolation region, which is disposed at an outermost portion of the chip; numeral 24 represents a dummy island formed to surround the chip 20 inside of the outermost $p^+$ isolation region 23, wherein the dummy island is comprised of an N-type epitaxial region; and numeral 25 represents an $N^+$-type cathode low resistance region arranged in the surface of the dummy island 24. The light shielding film 22 covers the surface of the peripheral circuit region of the semiconductor chip 20 except for the light receiving surface of the photodiode region (not shown). The end line of the light shielding film 22 extends near to the vicinity of a dicing line 35 so as to cover a portion of the dummy island 24. At the vicinity of the bonding pad 21, the end of the light shielding film 22 terminates near to the bonding pad 21 as shown in FIG. 1.

The dummy island 24 surrounds the circumference of the chip 20 positioned at inside of outermost $p^+$ region 23. At the vicinity of the bonding pads 21, 21, the dummy island extends to include the bonding pads 21, 21, namely the dummy island surrounds each rectangular shaped bonding pad 21 therein, and extends between bonding pads 21, 21 and the light shielding film 22. The cathode low resistance ($N^+$)region 25 surrounds the circumference of the chip 20 within the dummy island 24 and the $V_{cc}$ potential is applied through aluminum electrodes (not shown). Under the bonding pad 21, an electrically isolated island 24A is formed, which is isolated from the dummy island 24. A portion 25A of the cathode low resistance region 25 extends between the bonding pads 21 and 21.

As shown in FIGS. 2 and 3, the semiconductor chip 20 is composed of a P-type semiconductor substrate 26 and an $N^+$-type epitaxial layer 27 is formed on the P-type semiconductor substrate 26. A dummy island 24 is formed in the N-type epitaxial layer 27, and the dummy island 24 is isolated by the $P^+$-type isolation region 23.

An $N^+$-type buried layer 37 is arranged between the substrate 26 and the epitaxial layer 27 at the bottom of the dummy island 24. The buried layer is arranged in order to reduce the resistance of the dummy island, however it may be omitted if it is considered to be unnecessary.

A silicon oxide film 28 covers the surface of the epitaxial layer 27. A first layer 29 of the bonding pad 21 is formed on the silicon oxide film 28. A first interlayer insulating film 30 is formed on the first layer 29. A second layer 31 is formed on the first layer 29, with a through-hole formed in the first interlayer insulating film 30. In the same manner, a second interlayer insulating film 32 is formed on the second layer 31. A through hole is formed in the second interlayer insulating film 32, and then a third layer 33 is formed on the second layer 31 of the bonding pad 21. Finally a third insulating film 34 is formed as a passivation film on the third layer 33. Then openings for wire-bonding are formed upon the bonding pads 21, etc. The first, second, and third insulating films 30, 32, 34 are made of a silicon oxide film formed by CVD process, a silicon nitride film formed by CVD process, or an insulating film such as a polyimide series insulating film.

There are many electrically isolated islands like the dummy island 24 in the epitaxial layer 27 on the silicon substrate 26. In each island, a peripheral circuit element such as an NPN-type transistor or a photodiode itself is formed. Circuit elements such as transistors and the photodiode itself are connected with each other by aluminum metallization (not shown in the figure). The first metallization layer 29 and the second metallization layer 31 are utilized for internal connections between circuit elements, including the photodiode. The third mettalization layer 33 on the second insulating film 32 is utilized as a light shielding film 22 to cover almost all area of the chip 20 except for the exposure surface of the photodiode(not shown in the figure).

The dummy photodiode is formed by the PN junctions. One of the PN junctions is defined between the N-type epitaxial layer 27 of the dummy island 24 and the $p^+$-type isolation region 23, and the other is defined between the N-type epitaxial layer 27 and the P-type semiconductor substrate 26. In order to operate the semiconductor device, the ground potential (GND) is applied to the P-type semiconductor substrate 26 and the DC power supply potential $V_{cc}$ is applied to the $N^+$-type cathode low resistance region 25. By applying the above-mentioned bias potential, a depletion layer is formed across the above-mentioned PN junction, which acts as a dummy photodiode generating photo-current due to incident light.

The semiconductor chip 20, separated along the dicing line 35 is securely fixed on a lead frame and then is sealed with a resin which is transparent in order to receive a light signal of a wavelength e.g. 200 nm with by the photodiode. In FIG. 3, the distance between the dicing line 35 and the boundary of the isolation region 23 (PN junction)of the dummy island 24 is about 60 to 80 μm.

As described above, according to the present invention, the photodiode built-in semiconductor device is equipped with a dummy photodiode (PD) surrounding the circumference of the photodiode built-in chip 20. Hence most (more than 80%) of the light (shown with the arrow in FIG. 3) that is at a slant, or in a direction that is not perpendicular to the top surface of the chip 20, is absorbed at the above-mentioned PN junctions of the dummy photodiode by generating photo-carriers. Most of the generated photocarriers (electrons and holes) are converted into light current of the dummy photodiode, which flows from the $V_{cc}$ potential connected to the cathode low resistance region to the GND potential connected to the semiconductor substrate. Consequently, since the dummy island 24 shields light injections not perpendicular to the top surface of the chip, it can block light injections into the internal active region of the peripheral circuit elements or photodiodes itself in the active region. As a result, erroneous operation of the photodiode's periphery circuit is prevented.

Moreover, the dummy photodiode can absorb most of the light injections which are injected perpendicularly, or at a slant, to the top surface of the chip 20, through the slit formed between the bonding pad 21 and the light shielding film 22. Therefore, it can also remove adverse effects due to light injections into the internal circuit elements. As a result, formation of the extension region 11 of the bonding pad as shown in the prior art is not necessary any more. Thus a simplification of the structure of the bonding pads 21, 21 and a narrowing of the positioning space between the bonding pads 21,21 are attained.

A three-layered metallization structure has been explained in the present embodiment. However, it is obvious that the present invention is also applicable to a two-layered metallization structure, or a four-layered metallization structure.

This invention may be practiced or embodied in still other ways without departing from the spirit thereof. The preferred embodiments described herein are therefore illustrative and not restrictive to the scope of the inventions.

What is claimed is:

1. A photodiode built-in semiconductor device, comprising:
   a photodiode formed on a semiconductor chip for light signal reception,
   peripheral circuits formed on said semiconductor chip for processing said light signal received by said photodiode, and
   a dummy photodiode arranged on an outermost circumference of said semiconductor chip surrounding said photodiode and said peripheral circuits.

2. A photodiode built-in semiconductor device according to claim 1, wherein said dummy photodiode comprises an isolation region arranged at an outermost portion of a semiconductor chip, and said dummy island arranged inside of said isolation region.

3. A photodiode built-in semiconductor device according to claim 2, further comprising a light shielding film of a metallization electrode covering portions of said peripheral circuits.

4. The photodiode built-in semiconductor device according to claim 3, wherein said dummy island of said dummy photodiode is disposed under a space between bonding pads and said light shielding film.

5. A photodiode built-in semiconductor device according to claim 4, further comprising a cathode low resistance region disposed in said dummy island, wherein said cathode low resistance region is arranged to extend along between two bonding pads.

6. A photodiode built-in semiconductor device according to claim 1, further comprising a light shielding film of a metallization electrode covering portions of said peripheral circuits.

* * * * *